(12) United States Patent
Yamaguchi et al.

(10) Patent No.: US 11,309,215 B2
(45) Date of Patent: Apr. 19, 2022

(54) SEMICONDUCTOR DEVICE MANUFACTURING METHOD AND SUBSTRATE PROCESSING APPARATUS

(71) Applicant: TOKYO ELECTRON LIMITED, Tokyo (JP)

(72) Inventors: Tatsuya Yamaguchi, Nirasaki (JP); Syuji Nozawa, Nirasaki (JP); Nagisa Sato, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/419,536

(22) Filed: May 22, 2019

(65) Prior Publication Data

US 2019/0363011 A1 Nov. 28, 2019

(30) Foreign Application Priority Data

May 28, 2018 (JP) .............................. JP2018-101331

(51) Int. Cl.
| | | |
|---|---|---|
| H01L 21/768 | (2006.01) | |
| H01L 21/283 | (2006.01) | |
| H01L 21/308 | (2006.01) | |
| H01L 21/3205 | (2006.01) | |
| H01L 21/3065 | (2006.01) | |
| H01L 21/02 | (2006.01) | |

(52) U.S. Cl.
CPC .. *H01L 21/76877* (2013.01); *H01L 21/02203* (2013.01); *H01L 21/283* (2013.01); *H01L 21/308* (2013.01); *H01L 21/3065* (2013.01); *H01L 21/3205* (2013.01); *H01L 21/76802* (2013.01); *H01L 21/76834* (2013.01); *H01L 21/76898* (2013.01)

(58) Field of Classification Search
None
See application file for complete search history.

(56) References Cited

U.S. PATENT DOCUMENTS

| | | | | |
|---|---|---|---|---|
| 5,942,802 | A * | 8/1999 | Aoi | H01L 21/76807 257/759 |
| 2006/0069171 | A1* | 3/2006 | Prokopowicz | H01L 21/3121 521/61 |
| 2009/0152732 | A1* | 6/2009 | Nomura | H01L 21/76825 257/773 |
| 2012/0329273 | A1* | 12/2012 | Bruce | H01L 21/02203 438/653 |
| 2014/0353835 | A1 | 12/2014 | Chae et al. | |
| 2015/0332955 | A1* | 11/2015 | You | H01L 21/02126 438/666 |
| 2017/0033043 | A1* | 2/2017 | Lin | H01L 21/76826 |

FOREIGN PATENT DOCUMENTS

| | | |
|---|---|---|
| JP | 2012-54307 A | 3/2012 |
| JP | 2012-138503 A | 7/2012 |
| JP | 2018-22925 A | 2/2018 |

* cited by examiner

*Primary Examiner* — Nilufa Rahim
(74) *Attorney, Agent, or Firm* — Nath, Goldberg & Meyer; Jerald L. Meyer; Tanya E. Harkins

(57) ABSTRACT

A semiconductor device manufacturing method includes burying a void formed in a substrate with a polymer having a urea bond; forming an oxide film on the substrate; and desorbing a depolymerized polymer obtained by depolymerizing the polymer from the void through the oxide film.

6 Claims, 10 Drawing Sheets

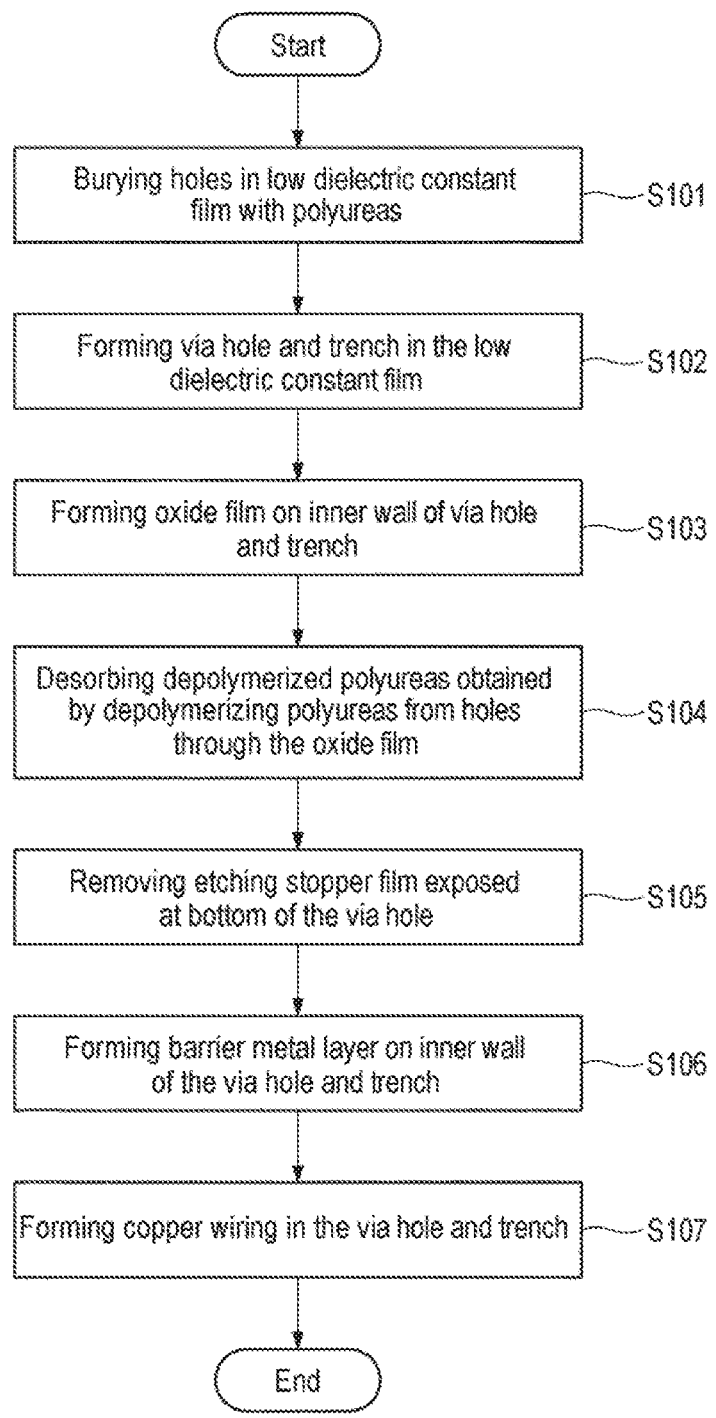

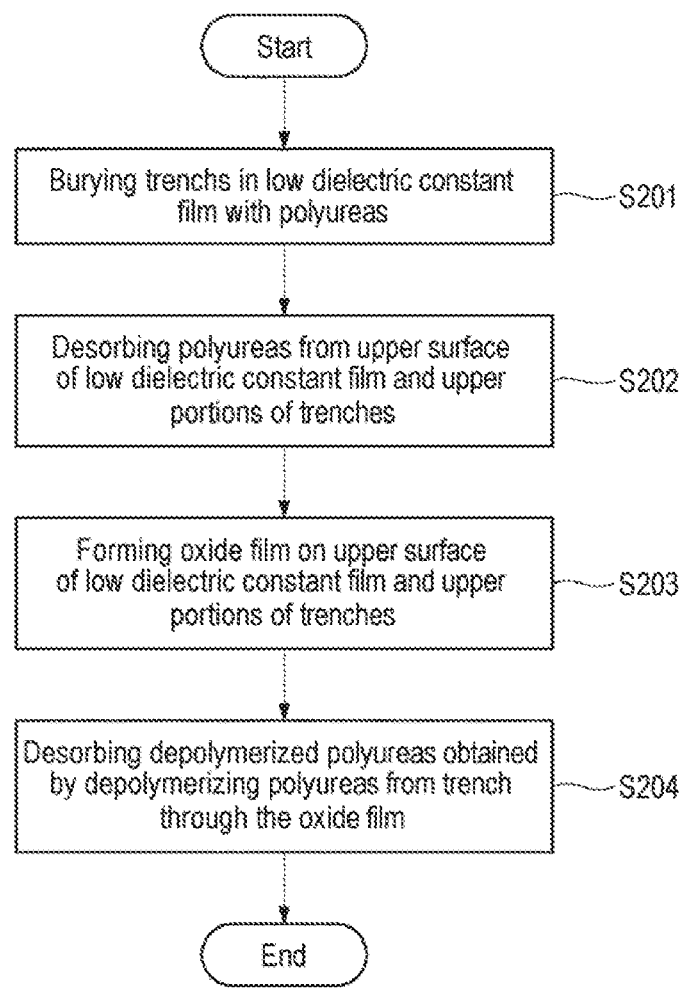

SEMICONDUCTOR DEVICE MANUFACTURING METHOD AND SUBSTRATE PROCESSING APPARATUS

CROSS-REFERENCE TO RELATED APPLICATION

This application is based upon and claims the benefit of priority from Japanese Patent Application No. 2018-101331, filed on May 28, 2018, the entire contents of which are incorporated herein by reference.

TECHNICAL FIELD

The present disclosure relates to a semiconductor device manufacturing method, and a substrate processing apparatus.

BACKGROUND

In the related art, a method of using voids as burying defects in burying recesses formed in a substrate with an interlayer insulating film is known as a method of reducing a relative dielectric constant of the interlayer insulating film in a multilayered semiconductor device (Japanese Laid-Open Patent Publication No. 2012-054307)

RELATED ART DOCUMENTS

Patent Documents

Patent Document 1: Japanese Laid-Open Patent Publication No. 2012-054307

SUMMARY

Some embodiments of the present disclosure provide a technique capable of securing a mechanical strength of an interlayer insulating film.

According to one embodiment of the present disclosure, there is provided a semiconductor device manufacturing method, including: burying a void formed in a substrate with a polymer having a urea bond; forming an oxide film on the substrate; and desorbing a depolymerized polymer obtained by depolymerizing the polymer from the void through the oxide film.

BRIEF DESCRIPTION OF DRAWINGS

The accompanying drawings, which are incorporated in and constitute a step of the specification, illustrate embodiments of the present disclosure, and together with the general description given above and the detailed description of the embodiments given below, serve to explain the principles of the present disclosure.

FIG. 11 is a flowchart illustrating a procedure of substrate process performed by a substrate processing apparatus according to an embodiment of the present disclosure.

FIG. 12 is a flowchart illustrating a procedure of substrate process performed by a substrate processing apparatus according to a modification of an embodiment of the present disclosure.

DETAILED DESCRIPTION

Embodiments of a semiconductor device manufacturing method and a substrate processing apparatus disclosed herein will now be described in detail with reference to the drawings. Further, the present disclosure is not limited to embodiments described below. In addition, it should be noted that the drawings are schematic, and the relationships between dimensions of respective elements, the ratios of the respective elements, and the like may differ from reality. Also, there may be a case where the relationship of dimensions and the ratios differ from each other between the drawings.

In the related art, a method of using voids as burying defects in burying a recess formed in a substrate with an interlayer insulating film is known as a method of reducing a relative dielectric constant of the interlayer insulating film in a multilayered semiconductor device.

On the other hand, the voids as burying defects formed in the interlayer insulating film are not supported by another film or the like. This may degrade a mechanical strength of the interlayer insulating film in which the void is formed.

Therefore, the mechanical strength of the interlayer insulating film needs to be secured.

<Semiconductor Device Manufacturing Method>

First, a semiconductor device manufacturing method according to an embodiment of the present disclosure will be described with reference to FIGS. 1A to 5C. FIGS. 1A to 5C are explanatory views illustrating some steps of the semiconductor device manufacturing method according to an embodiment of the present disclosure. Herein, an example in which the embodiment of the present disclosure is applied to a process of forming a wiring of a semiconductor device by dual damascene will be described.

Figure 1A:
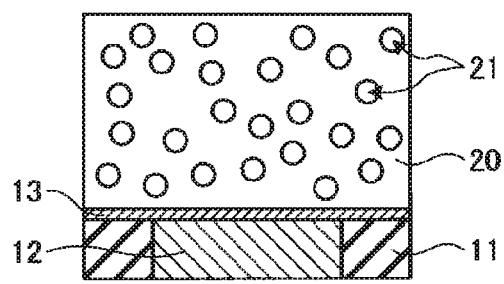
FIG. 1A is an explanatory view (1) illustrating a step of a semiconductor device manufacturing method according to an embodiment of the present disclosure.

As illustrated in FIG. 1A, in the embodiment, an interlayer insulating film 11, a copper wiring 12, an etching stopper film 13, and a low dielectric constant film 20 are formed on a semiconductor wafer W (see FIG. 7, hereinafter, referred to as a wafer W) as a substrate. The interlayer insulating film 11 is an interlayer insulating film on a lower layer side. The copper wiring 12 is buried in the interlayer insulating film 11, and functions as a portion of a multilayer wiring.

The etching stopper film 13 functions as a stopper in an etching process to be described later. The etching stopper film 13 is formed of, for example, silicon carbide (SiC), silicon carbonitride (SiCN), or the like.

The low dielectric constant film 20, which is an interlayer insulating film, is formed on the etching stopper film 13. In the embodiment, an SiOC film is used as the low dielectric constant film 20. Such an SiOC film is formed by, for example, plasmarizing diethoxymethylsilane (DEMS) in a CVD apparatus. Also, an SiOC film may be used as the interlayer insulating film 11 which is an underlying layer.

Furthermore, the low dielectric constant film 20 is porous, and has a plurality of holes 21 formed therein. In the embodiment, the holes 21 are an example of voids. In FIGS. 1A to 5C, the holes 21 are schematically illustrated with emphasis.

In the semiconductor device manufacturing method according to the embodiment of the present disclosure, as illustrated in FIG. 1A, the process starts from a state where an underlying circuit portion is formed on a front surface of the wafer W and the low dielectric constant film 20 is formed on the underlying circuit portion.

Figure 1B:
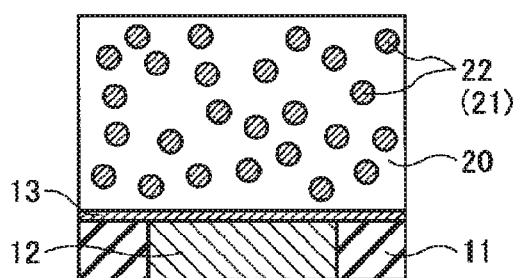
FIG. 1B is an explanatory view illustrating a step of the semiconductor device manufacturing method according to an embodiment of the present disclosure.

Subsequently, as illustrated in FIG. 1B, the holes 21 in the low dielectric constant film 20 are buried with respective polyureas 22. Each polyurea 22 is an example of polymer having a urea bond, and is formed by, for example, copolymerizing plural types of raw material monomers by vapor deposition polymerization.

Figure 6:
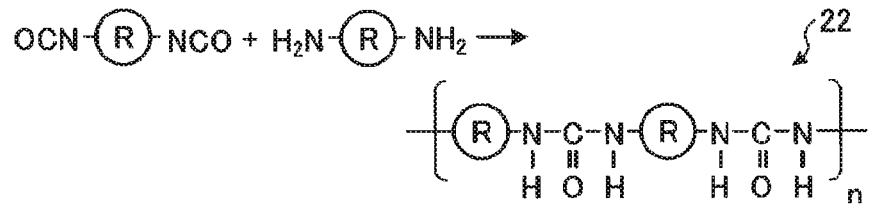
FIG. 6 is an explanatory view illustrating a state where a polymer having a urea bond according to an embodiment of the present disclosure is produced by a copolymerization-based reaction.

FIG. 6 is an explanatory view illustrating a state in which a polymer having a urea bond according to the embodiment of the present disclosure is produced by a copolymerization-based reaction. As illustrated in FIG. 6, the polyurea 22 may be formed by copolymerizing isocyanate and amine, which are raw material monomers, so that the urea bond is formed. In FIG. 6, R is, for example, an alkyl group (a linear alkyl group or a cyclic alkyl group) or an aryl group, and n is an integer of 2 or more.

An example of the amine may include an alicyclic compound or an aliphatic compound. An example of the alicyclic compound may include 1,3-bis (aminomethyl) cyclohexane (H6XDA). An example of the aliphatic compound may include 1,12-diaminododecane (DAD).

An example of the isocyanate may include an alicyclic compound, an aliphatic compound, an aromatic compound or the like. An example of the alicyclic compound may include 1,3-bis (isocyanatomethyl) cyclohexane (H6XDI). An example of the aliphatic compound may include hexamethylene diisocyanate.

Figure 7:
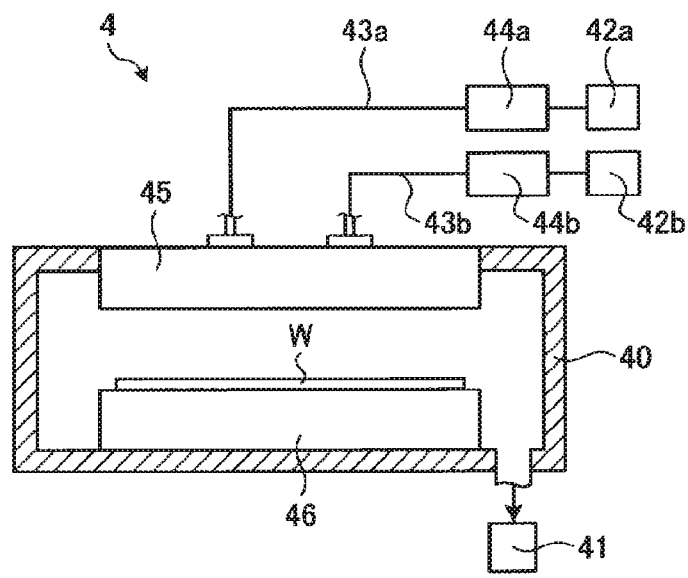
FIG. 7 is a cross-sectional view illustrating a configuration of a burying part according to an embodiment of the present disclosure.

The process of burying the holes 21 in the low dielectric constant film 20 with the polyureas 22 is performed in a burying part 4. FIG. 7 is a cross-sectional view illustrating a configuration of the burying part 4 according to an embodiment of the present disclosure. The burying part 4 is, for example, a CVD apparatus.

The burying part 4 includes a vacuum container 40 and an exhaust mechanism 41. The vacuum container 40 forms a vacuum atmosphere. The exhaust mechanism 41 exhausts the interior of the vacuum container 40 to form the vacuum atmosphere.

Furthermore, the vacuum container 40 is coupled to a raw material source 42a that stores isocyanate, which is a raw material monomer and stays in a liquid state, and a raw material source 42b that stores amine, which is a raw material monomer and stays in a liquid state, via supply pipes 43a and 43b, respectively.

The liquid of isocyanate and the liquid of amine supplied from the raw material sources 42a and 42b are vaporized by vaporizers 44a and 44b provided in the supply pipes 43a and 43b, respectively. Gases of isocyanate and amine are introduced into a shower head 45 which is a gas discharge part.

For example, the shower head 45 is provided in an upper portion of the vacuum container 40. A plurality of discharge holes is formed in a lower surface of the shower head 45. The shower head 45 discharges the isocyanate gas and the amine gas introduced thereinto through respective discharge holes into the vacuum container 40.

The wafer W loaded into the burying part 4 is mounted on a stage 46 equipped with a temperature adjustment mechanism. Then, the isocyanate gas and the amine gas are supplied toward the wafer W in a state where the interior of the vacuum container 40 is kept in a vacuum atmosphere of a predetermined pressure. Thus, vapor deposition polymerization reactions occur in the holes 21 such that the holes 21 are buried with the polyureas 22, respectively.

A temperature of the interior of the vacuum container 40 when performing the vapor deposition polymerization in this way may be set according to a type of the raw material monomers, and may be set at, e.g., 40 to 150 degrees C. For example, when a vapor pressure of the raw material monomer is relatively low, the temperature of the wafer W may be set to a relatively high temperature. When the vapor pressure of the raw material monomer is relatively high, the temperature of the wafer W may be set to a relatively low temperature.

The following is a description of the semiconductor device manufacturing method according to the embodiment of the present disclosure. As illustrated in FIG. 1B, after the holes 21 in the low dielectric constant film 20 are respectively buried with the polyureas 22, a process of forming a via hole 29 (see FIG. 3B) and a trench 30 (a groove for wiring burying, see FIG. 4A) is performed in the low dielectric constant film 20.

Figure 1C:
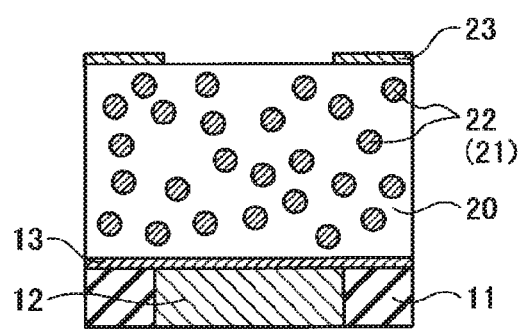
FIG. 1C is an explanatory view illustrating a step of the semiconductor device manufacturing method according to an embodiment of the present disclosure.

First, as illustrated in FIG. 1C, a portion corresponding to the trench 30 is opened on a front surface of the low dielectric constant film 20. For example, a hard mask 23 as a pattern mask for etching is formed by a known method. The hard mask 23 is formed of a titanium nitride (TiN) film.

Figure 2A:
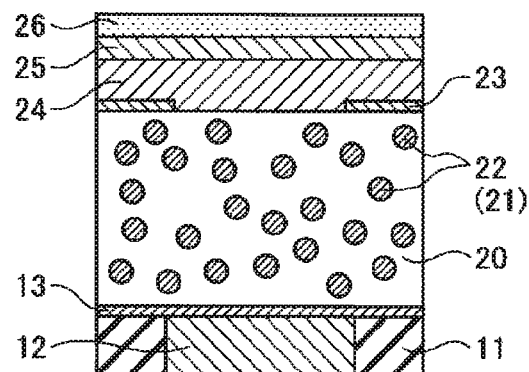
FIG. 2A is an explanatory view illustrating a step of the semiconductor device manufacturing method according to an embodiment of the present disclosure.

Subsequently, as illustrated in FIG. 2A, a mask film 24 used as a mask when etching the via hole 29, an antireflection film 25, and a resist film 26 are formed in this order on the low dielectric constant film 20 and the hard mask 23.

For example, an organic film containing carbon as a main component may be used as the mask film 24. The organic film may be formed by spin-coating a chemical solution on the wafer W, inside an apparatus for forming the antireflection film 25 and the resist film 26 to form a resist pattern.

Figure 2B:
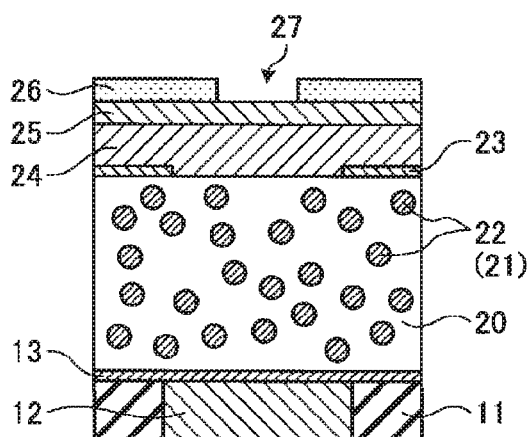
FIG. 2B is an explanatory view illustrating a step of the semiconductor device manufacturing method according to an embodiment of the present disclosure.
Figure 2C:
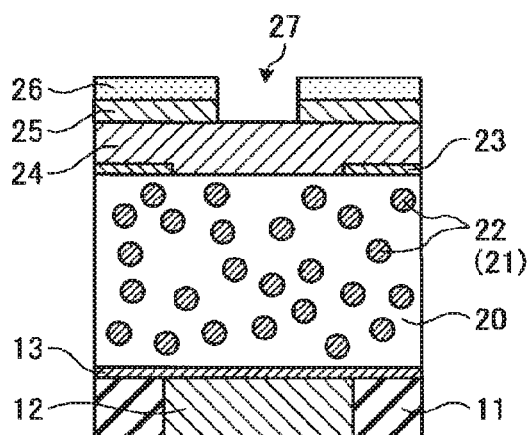
FIG. 2C is an explanatory view illustrating a step of the semiconductor device manufacturing method according to an embodiment of the present disclosure.

Subsequently, as illustrated in FIG. 2B, the resist film 26 is subjected to an exposure and development to form an opening 27 as the resist pattern in a portion corresponding to the via hole 29. Thereafter, as illustrated in FIG. 2C, the antireflection film 25 may be etched by a CF-based gas, using the resist pattern.

Figure 3A:
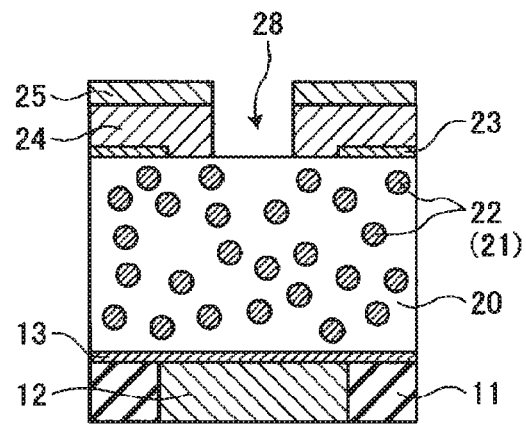
FIG. 3A is an explanatory view illustrating a step of the semiconductor device manufacturing method according to an embodiment of the present disclosure.

Subsequently, as illustrated in FIG. 3A, the mask film 24 is etched by, for example, a plasmarized oxygen gas through the use of the antireflection film 25 as a mask. The resist film 26 is also etched and removed by such plasma of the oxygen gas. As a result, an opening 28 is formed in the portion corresponding to the via hole 29 in the mask film 24.

Figure 3B:
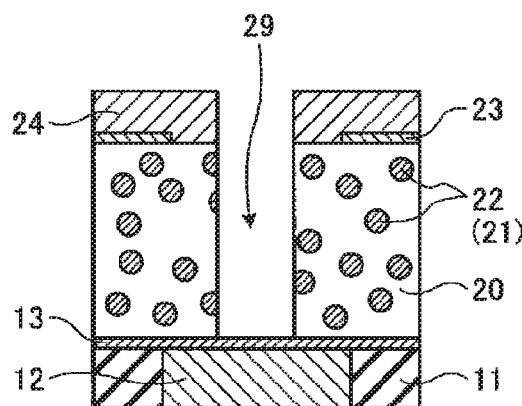
FIG. 3B is an explanatory view illustrating a step of the method of manufacturing the semiconductor device according to an embodiment of the present disclosure.

Subsequently, as illustrated in FIG. 3B, the low dielectric constant film 20 is etched using the mask film 24 as an etching mask to form the via hole 29. The etching of the low dielectric constant film 20, which is an SiOC film, may be performed by a plasmarized $C_6F_6$ gas. In this case, a small amount of oxygen gas may be further added to the $C_6F_6$ gas.

Figure 3C:
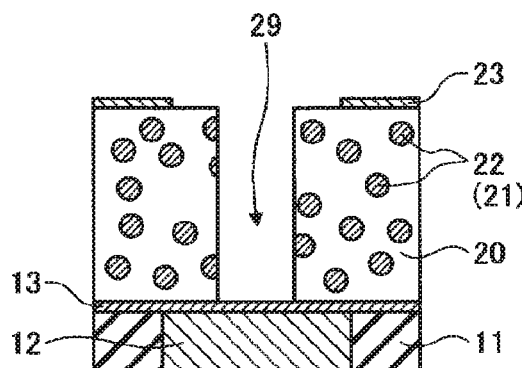
FIG. 3C is an explanatory view illustrating a step of the semiconductor device manufacturing method according to an embodiment of the present disclosure.
Figure 4A:
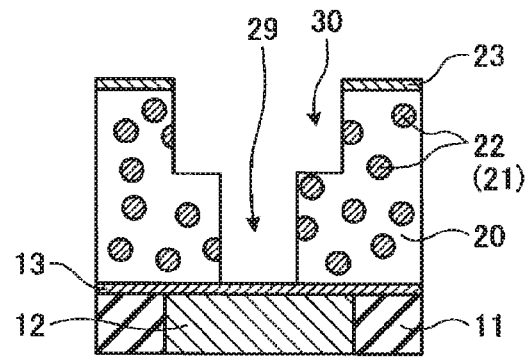
FIG. 4A is an explanatory view illustrating a step of the semiconductor device manufacturing method according to an embodiment of the present disclosure.

Thereafter, as illustrated in FIG. 3C, the mask film 24 is removed by ashing with the plasmarized oxygen gas. Then, as illustrated in FIG. 4A, the low dielectric constant film 20 is etched using the hard mask 23 by the same process as the process of forming the via hole 29 to form the trench 30 in a region surrounding the via hole 29.

Figure 4B:
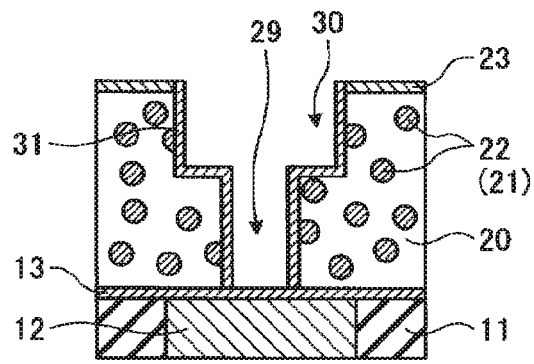
FIG. 4B is an explanatory view illustrating a step of the method of manufacturing the semiconductor device according to an embodiment of the present disclosure.

Subsequently, as illustrated in FIG. 4B, an oxide film 31 is formed on an inner wall of the via hole 29 and the trench 30. The oxide film 31 may be a low temperature oxide film (low temperature oxide: LTO) of $SiO_2$, and is a film sparsely formed relative to a thermal oxide film formed at a high temperature. For example, the oxide film 31 is formed by an oxide film forming part using an atomic layer deposition (ALD) method as a known method.

Figure 4C:
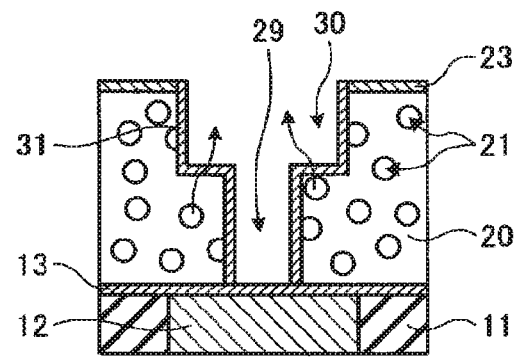
FIG. 4C is an explanatory view illustrating a step of the semiconductor device manufacturing method according to an embodiment of the present disclosure.

After the oxide film 31 is formed on the inner wall of the via hole 29 and the trench 30 in this way, as illustrated in FIG. 4C, the polyureas 22 buried in the holes 21 of the low dielectric constant film 20 are desorbed.

Figure 8:
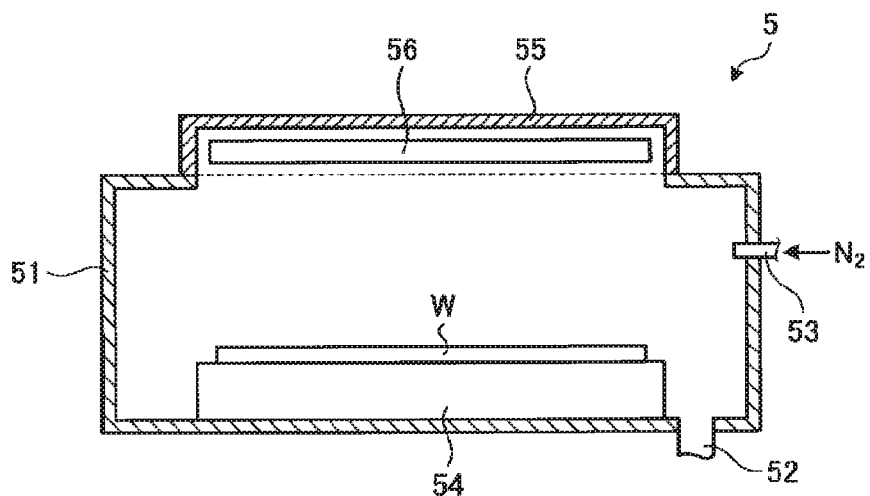
FIG. 8 is a cross-sectional view illustrating a configuration of a desorption part according to an embodiment of the present disclosure.

The process of desorbing the polyureas 22 buried in the holes 21 of the low dielectric constant film 20 is performed in a desorption part 5. FIG. 8 is a cross-sectional view illustrating a configuration of the desorption part 5 according to an embodiment of the present disclosure.

The desorption part 5 includes a process container 51 and an exhaust pipe 52. The process container 51 provides a processing atmosphere. The exhaust pipe 52 exhausts the interior of the process container 51 to form the processing atmosphere. The processing atmosphere is, for example, a normal pressure atmosphere, but may be a vacuum atmosphere.

A supply pipe 53 for supplying a nitrogen gas is connected to the process container 51. The wafer W loaded into the desorption part 5 is mounted on a stage 54. Then, the wafer W may be heated by operating an infrared lamp 56 received in a lamp house 55 in a state where the interior of the process container 51 is kept in a predetermined processing atmosphere.

By heating the polyureas 22 buried in the holes 21 to 300 degrees C. or higher, for example, 350 degrees C., they can be depolymerized into amine and isocyanate which are raw material monomers. Then, as the amine produced by such depolymerization passes through the oxide film 31 which is a sparse film, the polyureas 22 can be desorbed from the holes 21 in the low dielectric constant film 20 sealed with the oxide film 31.

In the embodiment, the polyureas 22 buried in the holes 21 can be desorbed while supporting the low dielectric constant film 20 in which the holes 21 are formed by the oxide film 31. Therefore, according to the embodiment, it is possible to secure the mechanical strength of the low dielectric constant film 20 whose relative dielectric constant is reduced by the holes 21.

In some embodiments, the process of forming the oxide film 31 may be performed at a temperature lower than that in the process of desorbing the polyureas 22. Thus, when the oxide film 31 is formed, it is possible to suppress the polyureas 22 buried in the holes 21 from causing a depolymerization reaction.

In addition, in the embodiment, the oxide film 31 may be sparsely formed by forming the oxide film 31 at a temperature lower than that in the desorbing process. Thus, it is possible to smoothly desorb the amine produced by the depolymerization through the oxide film 31.

Furthermore, in the embodiment, there has been described an example in which the holes 21 are buried with the polyureas 22, but the polymers for burying the holes 21 are not limited to the polyureas 22 which are macromolecules. For example, the polymers may not be macromolecules as long as they have urea bonds.

In the aforementioned desorbing process, in order not to adversely affect an element portion already formed on the wafer W, specifically the copper wiring 12, the wafer W may be heated at less than 400 degrees C., specifically 390 degrees C. or lower, more specifically 300 to 350 degrees C.

In addition, a period of time (heating time), during which the desorbing of the polyureas 22 is performed, may be 5 minutes or less, in view of suppressing thermal damage to the element. Therefore, a specific example of a heating recipe may be 350 degrees C. and 5 minutes or less.

Furthermore, a method using the infrared lamp 56 may be used as a heating method. The wafer W may be heated with mounted on the stage 54 including a built-in heater. Also, a heating atmosphere may be an atmosphere of an inert gas such as a nitrogen gas.

Figure 5A:
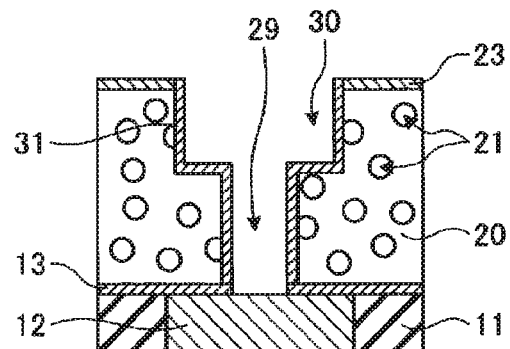
FIG. 5A is an explanatory view illustrating a step of the semiconductor device manufacturing method according to an embodiment of the present disclosure.

Subsequently, as illustrated in FIG. 5A, the etching stopper film 13 at the bottom of the via hole 29 is removed by etching. Such etching may be performed by a plasmarized $CF_4$ gas when the etching stopper film 13 may be an SiC film.

Figure 5B:
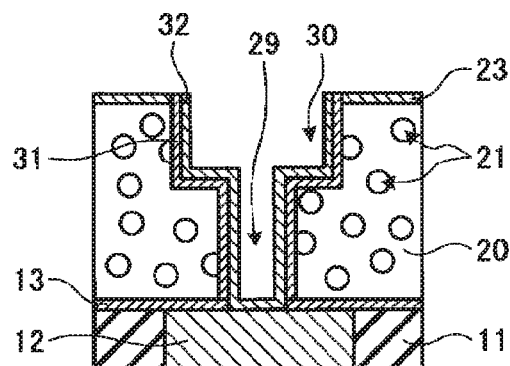
FIG. 5B is an explanatory view illustrating a step of the semiconductor device manufacturing method according to an embodiment of the present disclosure.

Subsequently, as illustrated in FIG. 5B, a barrier metal layer 32 is formed on the inner wall of the via hole 29 and the trench 30. The barrier metal layer 32 may be formed as a laminated film of Ti and TiON.

Figure 5C:
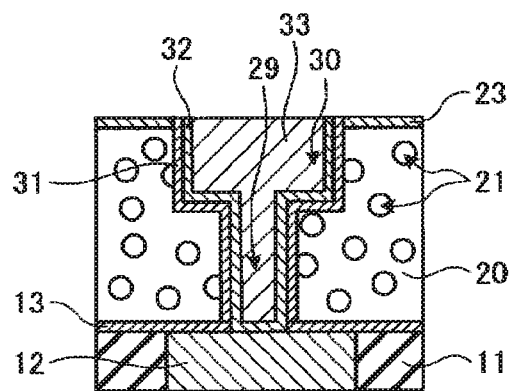
FIG. 5C is an explanatory view illustrating a step of the semiconductor device manufacturing method according to an embodiment of the present disclosure.

Finally, as illustrated in FIG. 5C, a copper wiring 33 is formed in the via hole 29 and the trench 30 to form an upper-lying circuit portion. Specifically, copper is buried in the via hole 29 and the trench 30, and excessive copper is removed by chemical mechanical polishing (CMP). Although not shown in FIG. 5C, a seed layer made of copper may be formed on a front surface of the barrier metal layer 32 before the copper wiring 33 is formed.

As described above, in the embodiment, after the oxide film 31 is formed on the inner wall of the via hole 29 and the trench 30, the etching stopper film 13 at the bottom of the via hole 29 is etched away. Thus, it is possible to suppress damage to the low dielectric constant film 20 by the etching of the etching stopper film 13.

In addition, in the embodiment, the barrier metal layer 32 is not directly formed on the low dielectric constant film 20 on the inner wall of the via hole 29 and the trench 30. The barrier metal layer 32 is formed on the low dielectric constant film 20 with the oxide film 31 formed between the barrier metal layer 32 and the low dielectric constant film 20. Thus, it is possible to suppress diffusion of constituent elements of the barrier metal layer 32 into the low dielectric constant film 20.

Furthermore, the substrate processing apparatus that performs various processes described so far includes a transfer mechanism, in addition to the burying part 4, the oxide film forming part, and the desorption part 5 described above. The transfer mechanism serves to transfer the wafer W between the burying part 4, the oxide film forming part, the desorption part 5, and the like.

In addition, the substrate processing apparatus according to an embodiment of the present disclosure includes a controller. The controller may be a computer, and includes a control part and a storage part. The control part includes a microcomputer having a central processing unit (CPU), a read only memory (ROM), a random access memory (RAM), an input/output port and the like, or various circuits.

The CPU of the microcomputer reads a program stored in the ROM and executes the same to realize controls of the burying part 4, the oxide film forming part, the desorption part 5, the transfer mechanism, and the like.

The program is recorded in a non-transitory computer-readable storage medium, or may be installed on the storage part of the controller from the storage medium. Examples of the computer-readable storage medium include a hard disk (HD), a flexible disk (FD), a compact disc (CD), a magneto-optical disc (MO), a memory card, and the like.

The storage part may be realized by a semiconductor memory device such as an RAM or a flash memory, or a storage device such as a hard disk or an optical disc.

The substrate processing apparatus according to an embodiment of the present disclosure includes the burying part 4, the oxide film forming part, the desorption part 5, and the transfer mechanism. The burying part 4 buries voids (holes 21) formed on the substrate (the wafer W) with polymers (the polyureas 22) having urea bonds. The oxide film forming part forms the oxide film 31 on the substrate (wafer W). The desorption part 5 depolymerizes the polymers (the polyureas 22) and desorbs the depolymerized polymers (the polyureas 22) from the voids (the holes 21) through the oxide film 31. The transfer mechanism transfers the wafer W between the respective parts that process the substrate (the wafer W). Thus, it is possible to secure the mechanical strength of the low dielectric constant film 20 whose relative dielectric constant is reduced by the voids.

<Modifications>

Next, a semiconductor device manufacturing method according to a modification of the embodiment of the present disclosure will be described with reference to FIGS. 9A to 10B. FIGS. 9A to 10B are explanatory views illustrating some steps of the semiconductor device manufacturing method according to the modification of the embodiment of the present disclosure.

Figure 9A:
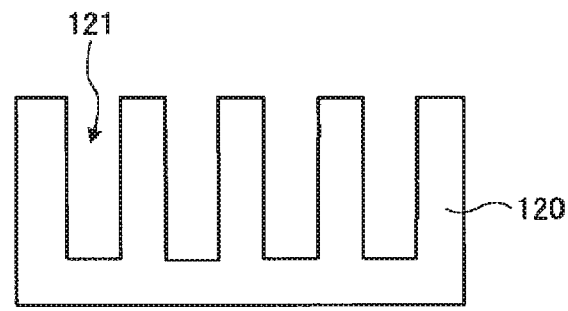
FIG. 9A is an explanatory view illustrating a step of a semiconductor device manufacturing method according to a modification of an embodiment of the present disclosure.

As illustrated in FIG. 9A, in the modification, a low dielectric constant film 120 is formed as an interlayer insulating film on a wafer W as a substrate. Furthermore, a plurality of trenches 121 is formed in the low dielectric constant film 120. In the modification, the trenches 121 are an example of voids.

Figure 9B:
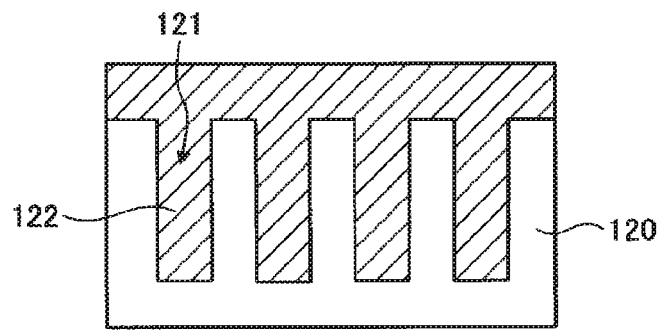
FIG. 9B is an explanatory view illustrating a step of the semiconductor device manufacturing method according to the modification of an embodiment of the present disclosure.

Subsequently, as illustrated in FIG. 9B, the trenches 121 in the low dielectric constant film 120 are buried with polyureas 122. The polyureas 122 are polymers having urea bonds as in the embodiment, and may be formed by copolymerizing plural types of raw material monomers by a vapor deposition polymerization. The polyureas 122 may be buried in the trenches 121 using the burying part 4 described above.

Furthermore, in the modification, a method of burying the trenches 121 with the polyureas 122 is not limited to the vapor deposition polymerization. As an example, a coating method may be used in burying the trenches 121 with the polyureas 122.

Figure 9C:
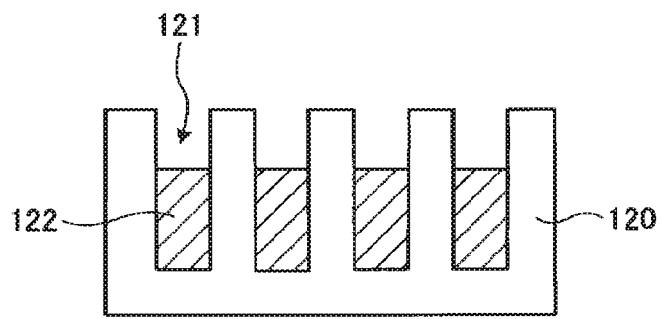
FIG. 9C is an explanatory view illustrating a step of the semiconductor device manufacturing method according to the modification of an embodiment of the present disclosure of the embodiment.

Subsequently, a predetermined heat treatment is performed on the low dielectric constant film 120 in which the trenches 121 are buried with the polyureas 122, so that the polyureas 122 are desorbed from an upper surface of the low dielectric constant film 120 and upper portions of the trenches 121, as illustrated in FIG. 9C.

Figure 10A:
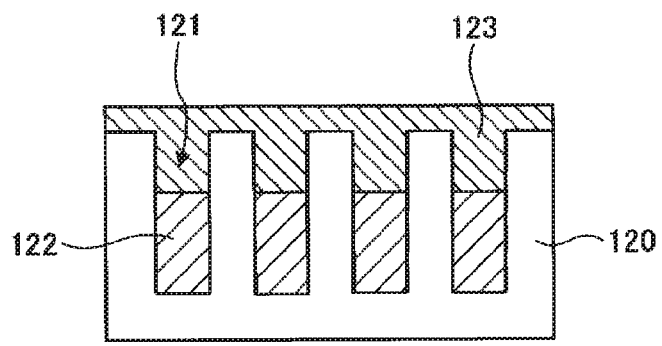
FIG. 10A is an explanatory view illustrating a step of the semiconductor device manufacturing method according to the modification of an embodiment of the present disclosure.

Subsequently, as illustrated in FIG. 10A, an oxide film 123 is formed on the upper surface of the low dielectric constant film 120. The oxide film 123 may be a low temperature oxide film (LTO) of $SiO_2$, and is a film sparsely formed relative to a thermal oxide film formed at a high temperature. Furthermore, in the modification, since the polyureas 122 are desorbed from the upper portions of the trenches 121, the oxide film 123 is also buried in the upper portions of the trenches 121.

Figure 10B:
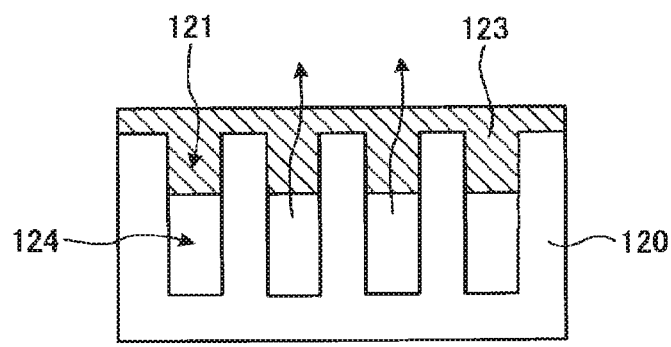
FIG. 10B is an explanatory view illustrating a step of the semiconductor device manufacturing method according to the modification of an embodiment of the present disclosure.

After the oxide film 123 is formed on the upper surface of the low dielectric constant film 120 and the upper portions of the trenches 121 in this way, as illustrated in FIG. 10B, the polyureas 122 buried in the trenches 121 of the low dielectric constant film 120 are desorbed. The polyureas 122 may be desorbed from the trenches 121 using the aforementioned desorption part 5.

In the modification, as the amine produced by the depolymerization of the polyureas 122 passes through the oxide film 123 which is a sparse film, the polyureas 122 can be desorbed from the trenches 121 in the low dielectric constant film 120 sealed with the oxide film 123. Voids 124 are formed in respective portions from which the polyureas 122 are desorbed.

In the modification, the voids 124 are formed in the low dielectric constant film 120. Thus, it is possible to reduce a relative dielectric constant of the low dielectric constant film 120 which is an interlayer insulating film. Further, in the modification, it is possible to desorb the polyureas 122 buried in the trenches 121 while supporting the trenches 121 of the low dielectric constant film 120 by the oxide film 123.

Therefore, according to the modification, it is possible to secure a mechanical strength of the low dielectric constant film 120 whose relative dielectric constant is reduced by the voids 124.

Furthermore, in the modification, the oxide film 123 is formed so as to be buried in the upper portions of the trenches 121 by desorbing the polyureas 122 in the upper portions of the trenches 121. Therefore, the oxide film 123 is held so as to become an anchor with respect to trenches 121. Thus, the oxide film 123 can be sufficiently held on the low dielectric constant film 120 even after the voids 124 are formed.

<Processing Procedures>

Next, procedures of substrate processes according to the embodiment and the modification will be described with reference to FIGS. 11 and 12. FIG. 11 is a flowchart illustrating the procedure of substrate process performed by the substrate processing apparatus according to the embodiment of the present disclosure.

First, the holes 21 in the low dielectric constant film 20 are buried with the polyureas 22 (in step S101). The polyureas 22 are an example of polymers having urea bonds, and may be formed by copolymerizing plural types of raw material monomers in the burying part 4 by a vapor deposition polymerization.

Subsequently, the via hole 29 and the trench 30 are formed in the low dielectric constant film 20 in which the holes 21 are buried with the polyureas 22 by the various processes described above (in step S102). Then, in the oxide film forming part, the oxide film 31 is formed on the inner wall of the via hole 29 and the trench 30 (in step S103). The oxide film 31 may be a low temperature oxide film of $SiO_2$, and is a film sparsely formed relative to a thermal oxide film formed at a high temperature.

Subsequently, in the desorption part 5, the polyureas 22 buried in the holes 21 are depolymerized and the depolymerized polyureas 22 are desorbed from the holes 21 through the oxide film 31 (in step S104). For example, in the desorption part 5, the polyureas 22 buried in the holes 21 may be depolymerized into amine and isocyanate as raw material monomers by heating the wafer W to 350 degrees C.

Subsequently, the etching stopper film 13 exposed at the bottom of the via hole 29 is removed by etching (in step S105). Then, the barrier metal layer 32 is formed on the inner wall of the via hole 29 and the trench 30 (in step S106).

Finally, the copper wiring 33 is formed in the via hole 29 and the trench 30 by the various processes described above (in step S107), and the substrate process is completed.

The semiconductor device manufacturing method according to the embodiment of the present disclosure includes a burying step (step S101), an oxide film forming step (step S103), and a desorption step (step S104). In the burying step (step S101), the voids (the holes 21) formed in the substrate (the wafer W) are buried with polymers (the polyureas 22) having urea bonds. In the oxide film forming step (step S103), the oxide film 31 is formed on the substrate (the wafer W). In the desorption step (step S104), the polymers (the polyureas 22) are depolymerized and the depolymerized polymers (the polyureas 22) are desorbed from the voids (the holes 21) through the oxide film 31. Thus, it is possible to secure the mechanical strength of the low dielectric constant film 20 whose relative dielectric constant is reduced by the voids.

Furthermore, in the semiconductor device manufacturing method according to the embodiment of the present disclosure, in the burying step (step S101), the voids (the holes 21) are buried with polymers (the polyureas 22) formed by a vapor deposition polymerization. Thus, the polyureas 22 can be sufficiently buried even in the fine holes 21 formed in the low dielectric constant film 20.

In addition, in the semiconductor device manufacturing method according to the embodiment of the present disclosure, the oxide film forming step (step S103) is performed at a temperature lower than that in the desorption step (step S104). Therefore, when the oxide film 31 is formed, it is possible to suppress the polyureas 22 buried in the holes 21 from causing a depolymerization reaction.

Furthermore, in the semiconductor device manufacturing method according to the embodiment of the present disclosure, the voids are the holes 21 formed inside the low dielectric constant film 20. Thus, it is possible to reduce the dielectric constant of the low dielectric constant film 20.

In addition, the semiconductor device manufacturing method according to the embodiment of the present disclosure further includes a via hole forming step (step S102) of forming the via hole 29 in the low dielectric constant film 20 in which the holes 21 are buried with the polymers (the polyureas 22). The oxide film forming step (step S103) is performed after the via hole forming step (step S103). Thus, it is possible to support the low dielectric constant film 20 in which the holes 21 and the via hole 29 are formed by the oxide film 31.

Furthermore, the semiconductor device manufacturing method according to the embodiment of the present disclosure further includes a removal step (step S105) of removing the etching stopper film 13 exposed at the bottom of the via hole 29 after the oxide film forming step (step S103). Thus, it is possible to suppress damage to the low dielectric constant film 20 by the etching of the etching stopper film 13.

In addition, the semiconductor device manufacturing method according to the embodiment of the present disclosure further includes a barrier metal layer forming step (step S106) of forming the barrier metal layer 32 on the oxide film 31 after the desorption step (step S104). Therefore, when the polyureas 22 are desorbed from the holes 21, it is possible to prevent the barrier metal layer 32 from causing an obstacle in such desorption, and to suppress the constituent elements of the barrier metal layer 32 from spreading into the low dielectric constant film 20.

FIG. 12 is a flowchart illustrating the procedure of substrate process performed by the substrate processing apparatus according to the modification of the embodiment of the present disclosure. First, in the burying part 4, the trenches 121 formed in the low dielectric constant film 120 are buried with the polyureas 122 (in step S201).

Subsequently, the polyureas 122 are desorbed from the upper surface of the low dielectric constant film 120 and the upper portions of the trenches 121 by performing a predetermined heat treatment (in step S202). Then, in the oxide film forming part, the oxide film 123 is formed on the upper surface of the low dielectric constant film 120 and the upper portions of the trenches 121 from which the polyureas 122 are desorbed (in step S203).

Subsequently, in the desorption part 5, the polyureas 122 buried in the trenches 121 are depolymerized and the depolymerized polyureas 122 are desorbed from the trenches 121 through the oxide film 123 (in step S204)), and the process is completed.

In the semiconductor device manufacturing method according to the modification of the embodiment of the present disclosure, the voids are the trenches 121 formed in the substrate (the wafer W). Thus, it is possible to reduce the relative dielectric constant of the low dielectric constant film 120.

The embodiment of the present disclosure has been described above. However, the present disclosure is not limited to the aforementioned embodiment but may be differently modified without departing from the spirit of the present disclosure. For example, in the aforementioned embodiment, there has been described the example in which the oxide film 31 is formed by the ALD method, but the oxide film 31 may be formed by a method other than the ALD method.

In the aforementioned embodiment, there has been described the example in which the polyureas 22 are used as the polymers buried in the holes 21, but the polymers are not limited to the polyureas. For example, polyurethanes having urethane bonds may be used as the polymers.

For example, each polyurethane may be synthesized by copolymerizing a monomer having an alcohol group and a monomer having an isocyanate group. Further, each polyurethane may be heated at a predetermined temperature such that each polyurethane is depolymerized into a monomer having an alcohol group and a monomer having an isocyanate group.

Therefore, the polyurethanes, instead of the polyureas 22 described above, may be used as the polymers to be buried in the holes 21. Furthermore, polymers other than the polyureas and the poly urethanes may be used as the polymers to be buried in the holes 21 as long as they are depolymerizable polymers.

Furthermore, in the aforementioned embodiment, there has been described the example in which the low temperature oxide film of $SiO_2$ is used as the oxide film 31, but the present disclosure is not limited thereto. For example, a porous film such as SiOC may be used as the oxide film.

According to the present disclosure in some embodiments, it is possible to secure a mechanical strength of an interlayer insulating film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method, comprising:
    burying a void that is a hole inside a porous low dielectric constant film formed on a substrate with a polymer having a urea bond;
    forming an oxide film on an inner wall of a via hole in the low dielectric constant film in which the void is buried; and
    desorbing a depolymerized polymer obtained by depolymerizing the polymer from the void through the oxide film, before forming a barrier metal layer on the oxide film.

2. The method of claim 1, wherein the burying further comprises burying the void with the polymer formed by a vapor deposition polymerization.

3. The method of claim 1, wherein the forming an oxide film is performed at a temperature lower than a temperature in the desorbing.

4. The method of claim 1, further comprising:
    forming the via hole in the low dielectric constant film in which the hole is buried with the polymer, wherein the forming an oxide film is performed after forming the via hole.

5. The method of claim 4, further comprising: removing an etching stopper film exposed at a bottom of the via hole, the removing occurs after the forming an oxide film.

6. The method of claim 4, further comprising:
    forming the barrier metal layer on the oxide film, the forming the barrier metal layer occurs after the desorbing a depolymerized polymer.

* * * * *